United States Patent [19]
Ogawa

[11] Patent Number: 6,137,326
[45] Date of Patent: Oct. 24, 2000

[54] CLOCK SIGNAL PRODUCING DEVICE

[75] Inventor: Hideaki Ogawa, Yokohama, Japan

[73] Assignee: Victor Company of Japan, Ltd., Yokohama, Japan

[21] Appl. No.: 09/323,780

[22] Filed: Jun. 1, 1999

[30] Foreign Application Priority Data

Jun. 2, 1998 [JP] Japan .................................. 10-152619

[51] Int. Cl.[7] ...................................................... H03L 7/06
[52] U.S. Cl. ........................................... 327/156; 327/159
[58] Field of Search ..................................... 327/146–147, 327/150, 155, 156, 159, 162, 163; 331/17; 375/373–376

[56] References Cited

U.S. PATENT DOCUMENTS

| | | | |
|---|---|---|---|
| 3,913,028 | 10/1975 | Bosselaers | 331/1 A |
| 5,382,921 | 1/1995 | Estrada et al. | 331/17 |
| 5,506,982 | 4/1996 | Hotta et al. | 395/550 |
| 5,737,373 | 4/1998 | Sato et al. | 375/376 |
| 6,046,645 | 4/2000 | Cucchi et al. | 331/1 R |
| 6,072,369 | 6/2000 | Dhong et al. | 331/17 |

FOREIGN PATENT DOCUMENTS 7-336711   12/1995   Japan .
10-28052   1/1998   Japan .

*Primary Examiner*—My-Trang Nuton
*Attorney, Agent, or Firm*—Anderson, Kill & Olick P.C.

[57] ABSTRACT

A clock signal producing device produces a clock signal, which is in synchronism with an inputted reference signal and has a frequency other than a frequency of an integer multiple of the reference signal or other than a frequency of the reference signal divided by an integer. The clock signal producing device is provided with the low pass filter (LFP) 4 and the frequency dividing section 10 comprising the phase calculation section 1, the sinusoidal calculation section 2, and the D/A (digital to analog) converting section 3. An output signal of the LPF 4 is supplied to the phase comparator 5. The phase calculation section 1 calculates a phase $\theta(nT)$ of the reference signal $S_{REF}$ separately in a integer part and in a decimal part at a time of generation t=nT, where "n" is an integer and T is a period of the clock signal $S_{CL}$, and outputs a value of the integer part as a digital phase value. The sinusoidal calculation section 2 converts the digital phase value into an amplitude value of a sinusoidal wave signal. The amplitude value is converted from digital to analog and supplied to the phase comparator 5.

2 Claims, 2 Drawing Sheets

CLOCK SIGNAL PRODUCING DEVICE

BACKGROUND OF THE INVENTION

1. Field of the Invention

The present invention relates to a clock signal producing device utilized for a video apparatus such as a video tape recorder.

2. Description of the Related Art

FIG. 1 is a block diagram of a clock signal producing device of the prior art as an example of its configuration. The clock signal producing device comprises a phase comparator 101, a loop filter 102, a voltage controlled oscillator (referred to as VCO) 103 and a ¼ frequency divider 104. A clock signal $S_{CL}$ outputted from the VCO 103 is divided into ¼ by the ¼ frequency divider 104. The phase comparator 101 compares a clock signal $S_{CL}$ divided into ¼ with a reference signal $S_{REF}$ in a phase. An output signal from the phase comparator 101, that is, a phase error signal is supplied to the loop filter (low pas filter) 102. The loop filter 102 eliminates high frequency components of the phase error signal. An output signal from the loop filter 102 is supplied to a control terminal of the VCO 103. Accordingly the VCO 103 outputs the clock signal $S_{CL}$ of a frequency in response to an output of the loop filter 102 which is supplied to the control terminal of the VCO 103. According to this configuration, a clock signal $S_{CL}$ is obtained, wherein a frequency of the clock signal $S_{CL}$ is 4 times higher than that of a reference signal $S_{REF}$ and a phase of the clock signal $S_{CL}$ is locked with that of the reference signal $S_{REF}$. For example, in a video tape recorder (referred to as VTR), it is conceivable that a signal having a frequency $f_{SC}$ of a color sub-carrier is employed as a reference signal $S_{REF}$ so as to obtain a clock signal $S_{CL}$ of a frequency of $4 \times f_{SC}$.

A delay device having a delay time of 1 H (one horizontal scanning period) is necessary for processing a vertical synchronizing signal of video signals in a VTR. In case that a circuit is designed for coping with various broadcasting systems such as NTSC and PAL, it is necessary to prepare a wide variety of delay stages (i.e. 1 H/clock period) of a delay device in response to the various broadcasting systems if a clock frequency $f_{CL}$ of the delay device is set to an integer multiple of a color sub-carrier frequency $f_{SC}$. In addition thereto, a configuration of the circuit becomes more complicated. For example, a number of delay stages of a 1 H delay device is 1135 stages for the PAL while 910 stages for the NTSC, in case that a clock frequency is set to 4 times the color sub-carrier frequency $f_{SC}$, that is, $4 \times f_{SC}$.

With respect to a frequency of a reference signal as a clock signal of a digital signal processing circuit, a digital VTR complying with the DV (Digital Video) Standard or the DVC (Digital Video Cassette) Standard employs a frequency such as 13.5 MHz, which is not an integer multiple of a color sub-carrier frequency $f_{SC}$ for any broadcasting systems. It is difficult to produce a clock signal of a frequency, which is not an integer multiple of a color sub-carrier frequency $f_{SC}$, from a reference signal of a frequency $f_{SC}$ inputted to the phase comparator 101 by the conventional circuit as shown in FIG. 1.

SUMMARY OF THE INVENTION

Accordingly, an object of the present invention is to provide a clock signal producing device which can produce a clock signal being in synchronism with an inputted reference signal and further having a frequency other than a frequency of an integer multiple of the reference signal or other than a frequency of the reference signal divided by an integer.

In order to achieve the above object, the present invention provides, according to an aspect thereof, a clock signal producing device of producing a clock signal, which is in synchronism with a reference signal to be inputted. The clock signal producing device comprises phase calculation means for calculating a digital phase value which is in synchronism with the clock signal and indicates a phase of the reference signal when the clock signal is produced, sinusoidal wave converting means for converting the digital phase value outputted from the phase calculation means into an amplitude value of a sinusoidal wave signal, D/A (digital to analog) converting means for converting an output signal from the sinusoidal wave converting means into an analog signal, phase comparing means for comparing a phase between an output signal of the D/A converting means and the reference signal and for outputting a phase error signal therefore, and a voltage controlled oscillator (VCO) being driven by an output of the phase comparing means. The clock signal producing device is characterized by outputting an output of the VCO as the clock signal. The phase calculation means forms a digital value indicating a phase of the reference signal into an integer part and a decimal part, and is characterized by operating the digital value with adding a predetermined value to respective values of the integer part and the decimal part at a time when the clock signal is produced, and is further characterized by outputting only the integer part obtained as a result of the operation as the digital value of the phase.

Other object and further features of the present invention will be apparent from the following detailed description when read in conjunction with the accompanying drawings.

DETAILED DESCRIPTION OF THE PREFERRED EMBODIMENTS

Embodiment

Figure 2:
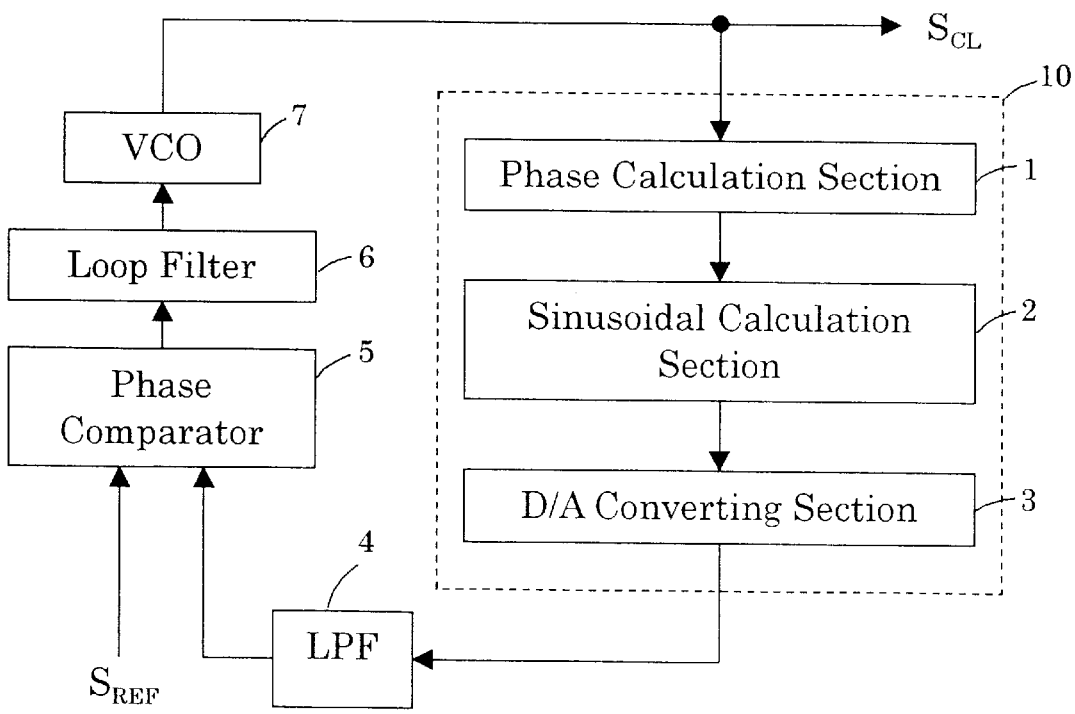
FIG. 2 shows a block diagram of a clock signal producing device according to an embodiment of the present invention.

FIG. 2 is a block diagram of a clock signal producing device according to an embodiment of the present invention.

Figure 3:
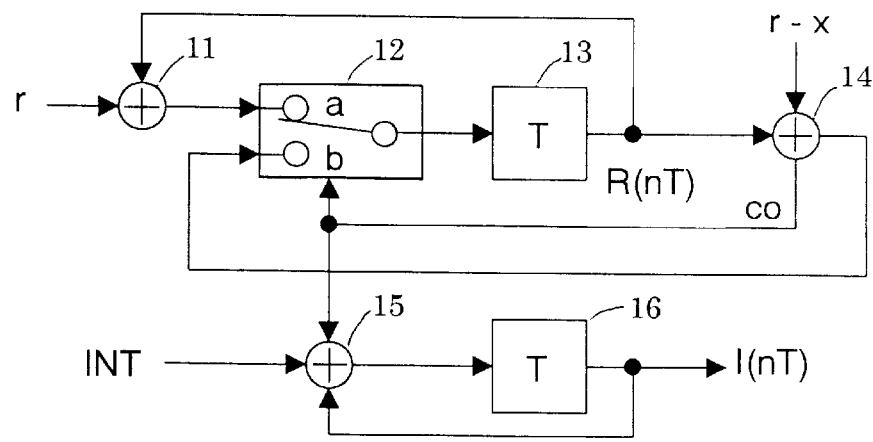
FIG. 3 shows a block diagram of a phase calculation section of the clock signal producing device shown in FIG. 2.

FIG. 3 is a block diagram of a phase calculation section of the clock signal producing device shown in FIG. 2.

Figure 4:
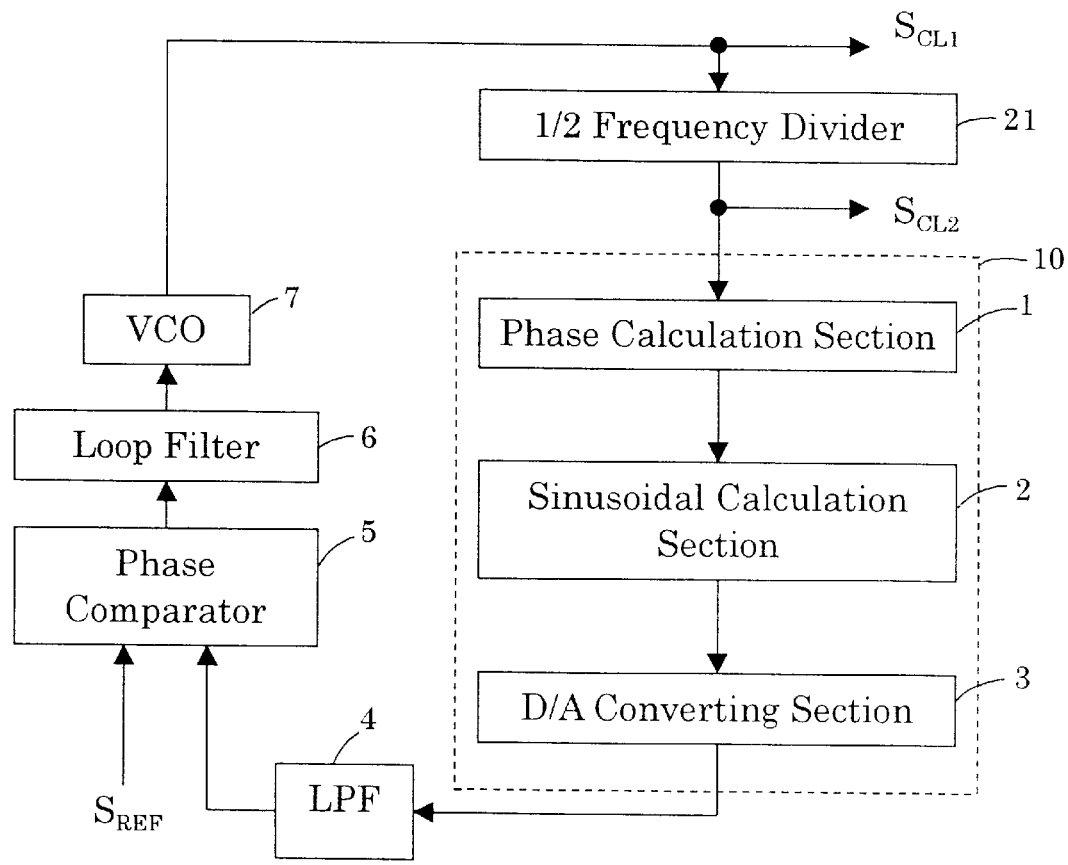
FIG. 4 shows a block diagram of another clock signal producing device according to the embodiment of the present invention.

FIG. 4 is a block diagram of another clock signal producing device according to the embodiment of the present invention.

Figure 1:
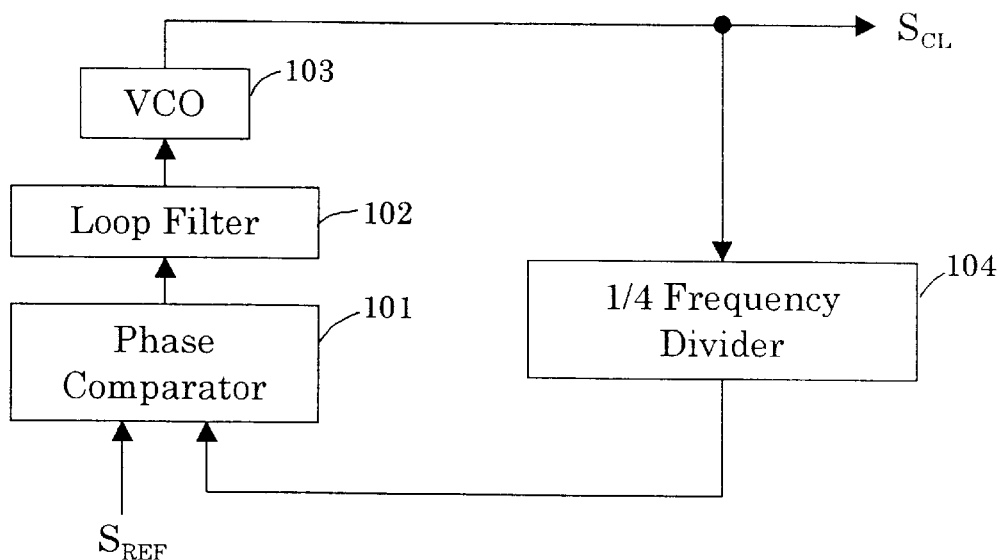
FIG. 1 shows a block diagram of a clock signal producing device according to the prior art.

In FIG. 2, functions of a phase comparator 5, a loop filter 6, and a VCO (Voltage Controlled Oscillator) 7 are similar to those devices of the prior art shown in FIG. 1. In an embodiment, the present invention provides a clock signal producing device. According to the embodiment, as shown in FIG. 2, the clock signal producing device comprises a frequency dividing section 10 including a phase calculation section 1 and a sinusoidal calculation section 2 and a D/A converting section 3, and a low pass filter (LPF) 4. An output signal of the LPF 4 is supplied to the phase comparator 5. The phase calculation section 1 calculates a phase θ(nT) of a reference signal $S_{REF}$ at a rising time t=nT (where, "n" is an integer and T is a period of the clock signal $S_{CL}$) of a clock signal $S_{CL}$ as shown below, wherein a timing of either falling or zero cross can also be acceptable for the calculation. With assuming that a frequency $f_{CL}$ of the clock signal $S_{CL}$ is not an integer multiple of a frequency $f_{REF}$ of the reference signal $S_{REF}$, for example, $f_{CL}=a \times f_{REF}$ (where, a multiplier "a" is 7.5 times), a sampling phase of the reference signal $S_{REF}$ is shifted slightly by each one clock if the reference signal $S_{REF}$ is sampled by a period T of the clock signal $S_{CL}$. In case that an increment of phase per one clock is defined as $\Delta\theta$, the sampling phase can be expressed as a following equation.

$$\theta((n+1)T)=\theta(nT)+\Delta\theta \quad (1)$$

If a phase from zero to $2\pi$ [rad] of the reference signal $S_{REF}$ is divided into 1024 equal parts and the phase is expressed in a 10 bit digital phase value, an increment of phase per one clock $\Delta\theta$ is as follows:

$$\Delta\theta=1024/a \quad (2)$$

In case that the $\Delta\theta$ is expressed in a integer part INT and a decimal part or a fraction part r/x as shown in an equation (3) below, a following equation (4) can be developed from the equation (1).

$$\Delta\theta=INT+r/x \quad (3)$$

where INT, "r", and "x" are respectively an integer.

$$\theta((n+1)T)=\theta(nT)+INT+r/x \quad (4)$$

If let "a"=7.5, then INT=136, "r"=8, and "x"=15 respectively.

If the phase $\theta(nT)$ is also expressed in an integer part I(nT) and a decimal part R(nT)/x as shown in the following equation (5), a phase $\theta((n+1)T)$ which follows after the phase $\theta(nT)$ by one clock is given by following equations (6) and (7).

$$\theta(nT)=I(nT)+R(nT)/x \quad (5)$$

where I(nT) and R(nT) are respectively an integer.

$$\theta((n+1)T)=I(nT)+INT+(R(nT)+r)/x \quad (6)$$

where $(R(nT)+r)<x$.

$$\theta((n+1)T)=I(nT)+INT+1+(R(nT)+r-x)/x \quad (7)$$

where $(R(nT)+r)\geq x$.

In other words, the equation (6) is equivalent to a case that the decimal part $(R(nT)+r)/x$ is not taken a figure up and the equation (7) is equivalent to a case that the decimal part $(R(nT)+r)/x$ is taken a figure up.

Since the phase $\theta(nT)$ itself is not an integer, it can not be expressed in a finite bit length. However, the phase calculation section 1 accumulates an increment of phase $\Delta\theta$ as a formula of (integer part+decimal part) by the equations (6) and (7) when the phase calculation section 1 calculates $\theta((n+1)T)$, $\theta((n+2)T)$, and subsequent phases. Further, the phase calculation section 1 is organized to output an integer part of a phase $\theta(nT)$, which is calculated by adding a figure up occurred in a decimal part to the integer part, as a digital phase value. Therefore, a digital phase value can be obtained in a finite bit length and in less error.

FIG. 3 is an exemplary block diagram of the phase calculation section 1 shown in FIG. 2. Accordingly, the phase calculation section 1 comprises two accumulators 11 and 14, which are utilized for calculating a decimal part or a fraction part of a phase, one accumulator 15 for calculating an integer part of the phase, a switch 12, and one clock delay circuits 13 and 16. Wherein variables such as "r", "x", R(nT), INT, and I(nT) are respectively an integer as mentioned above.

The accumulator 11 is utilized for calculating an accumulation which is equivalent to $R((n+1)T)=R(nT)+r$. The accumulator 14 is utilized for calculating an accumulation equivalent to $R((n+1)T)=R(nT)+r-x$. The accumulator 15 is utilized for calculating an accumulation equivalent to $I((n+1)T)=I(nT)+INT+co$. Wherein the "co" is a figure up variable of "1" when a figure up is taken in the accumulator 14, that is, when $(R(nT)+r)\geq x$, and wherein the "co" is a figure up variable of "0" when a figure up is not taken in the accumulator 14, that is, when $(R(nT)+r)<x$. The switch 12 is switched over to a terminal "a" when the figure up variable "co" is "0" and switched over to a terminal "b" when the figure up variable "co" is "1". Therefore, an output of the accumulator 11 is selected and the $R((n+1)T)=R(nT)+r$ is employed when the figure up variable "co" is "0". An output of the accumulator 14 is selected and the $R((n+1)T)=R(nT)+r-x$ is employed when the "co" is "1".

Accordingly, the phase calculation section 1 calculates an integer part I(nT) of a phase $\theta(nT)$ and inputs the integer part I(nT) to the sinusoidal calculation section 2.

The sinusoidal calculation section 2 refers a table previously stored in a ROM (Read Only Memory) in response to an integer part I(nT) of a phase $\theta(nT)$ and calculates a sinusoidal value, that is, an amplitude of a sinusoidal wave which is equal to $\sin\{I(nT) \times 2\pi/1024\}$. In other words, the sinusoidal calculation section 2 converts a digital phase value I(nT) into an amplitude value of a sinusoidal wave signal equal to $\sin\{I(nT) \times 2\pi/1024\}$. In this case, it is possible to store all sinusoidal values of a reference signal $S_{REF}$ for one period in the ROM, or it is acceptable to store sinusoidal values only for ¼ period from zero to $\pi/2$ in the ROM then obtain a sinusoidal value in response to a phase I(nT) with performing a converting operation in accordance with the phase I(nT).

The D/A converting section 3 converts a sinusoidal value in digital outputted from the sinusoidal calculation section 2 into an analog value, that is, a digital to analog conversion is performed. An output signal from the D/A converting section 3 is supplied to the phase comparator 5 through the LPF 4. A phase-locked loop (PLL) of the block diagram shown in FIG. 2 operates, so that an output signal of the LPF 4, which is a comparison signal of the same frequency as that of the reference signal $S_{REF}$, becomes a predetermined phase relation with the reference signal $S_{REF}$. Accordingly, a clock signal $S_{CL}$, which is in synchronism with the reference signal $S_{REF}$ and is not an integer multiple of a frequency of the reference signal $S_{REF}$, can be obtained.

In addition thereto, in case that the frequency $f_{CL}$ of the clock signal $S_{CL}$ is an integer multiple of the frequency $f_{REF}$ of the reference signal $S_{REF}$, it is proper that a calculation in the phase calculation section 1 is performed only for an integer part.

Accordingly, by utilizing the clock signal producing device described in the above mentioned embodiment, an arbitrary delay time in response to various broadcasting systems such as NTSC or PAL can easily be obtained, for example, with fixing a number of stages of 1 H delay device. In other words, in case that a frequency $f_{CL}$ of the clock signal $S_{CL}$ is set to "a" times the reference signal frequency $f_{REF}$, where "a" is an arbitrary positive numerical value, a clock signal $S_{CL}$, which is in synchronism with the reference signal $S_{REF}$ and is in a different frequency from that of the reference signal $S_{REF}$, can easily be produced by setting the variables "r", "x", and INT in the above equations (6) and (7) in accordance with the multiplier "a".

While the invention has been described above with reference to specific embodiment thereof, it is apparent that many changes, modifications and variations in the arrangement of equipment and devices can be made without departing from the invention concept disclosed herein. For example, as shown in FIG. 4, a clock signal producing device can be realized with providing a ½ frequency divider 21. The clock signal producing device produces a clock signal $S_{CL2}$, which is a half of a frequency of a clock signal $S_{CL1}$, in conjunction with the clock signal $S_{CL1}$.

In addition thereto, a resolving power is 0.35 degree if an operation in the phase calculation section 1 is performed with 10 bits as mentioned above. However, a number of bits can arbitrarily be increased or decreased in accordance with a necessary accuracy. A number of quantization bits of a sinusoidal value in the sinusoidal calculation section 2 can also be increased or decreased.

According to the aspect of the present invention, a digital phase value, which is in synchronism with an outputted clock signal and indicates a phase of a reference signal when the clock signal is produced, is calculated. The digital phase value is converted into an amplitude value of a sinusoidal wave signal, then the digital phase value is converted into an analog sinusoidal wave signal. Finally the analog sinusoidal wave signal is compared with the reference signal in a phase. The digital value indicating a phase of the reference signal is composed of an integer part and a decimal part. By adding a predetermined value to the integer and decimal parts at each time when a clock signal is produced, the digital value indicating the phase of the reference signal is operated. A clock signal, which is in synchronism with an input reference signal and is not an integer multiple of a frequency of the reference signal, is produced since only the integer part obtained as a result of the operation is outputted as the digital phase value.

What is claimed is:

1. A clock signal producing device of producing a clock signal being in synchronism with a reference signal to be inputted, said clock signal producing device comprising:

phase calculation means for calculating a digital phase value being in synchronism with said clock signal and indicating a phase of the reference signal when said clock signal being produced;

sinusoidal wave converting means for converting the digital phase value outputted from said phase calculation means into an amplitude value of a sinusoidal wave signal;

D/A (digital to analog) converting means for converting an output signal from said sinusoidal wave converting means into an analog signal;

phase comparing means for comparing a phase between an output signal of said D/A converting means and the reference signal and for outputting a phase error signal therefore; and a voltage controlled oscillator being driven by an output of said phase comparing means, said clock signal producing device characterized by outputting an output of said voltage controlled oscillator as the clock signal.

2. A clock signal producing device in accordance with claim 1, wherein said phase calculation means forms a digital value indicating a phase of the reference signal into an integer part and a decimal part, and is characterized by operating the digital value with adding a predetermined value to respective values of the integer part and the decimal part at a time when the clock signal is produced, and is further characterized by outputting only the integer part obtained as a result of the operation as the digital value of the phase.

* * * * *